United States Patent [19]

Berndt

[11] Patent Number: 4,628,217
[45] Date of Patent: Dec. 9, 1986

[54] FAST SCAN/SET TESTABLE LATCH USING TWO LEVELS OF SERIES GATING WITH ONE CURRENT SOURCE

[75] Inventor: Dale F. Berndt, Plymouth, Minn.

[73] Assignee: Sperry Corporation, New York, N.Y.

[21] Appl. No.: 592,149

[22] Filed: Mar. 22, 1984

[51] Int. Cl.$^4$ .......................................... H03K 19/086
[52] U.S. Cl. ................................. 307/467; 307/455; 307/272 R; 307/291; 307/465
[58] Field of Search .............. 307/443, 454, 455, 559, 307/465–467, 272 R, 272 A, 276, 291; 365/190; 371/25; 324/73 R, 158 R

[56] References Cited

U.S. PATENT DOCUMENTS

| 4,298,980 | 11/1981 | Hajdu et al. | 371/25 |
| 4,476,431 | 10/1984 | Blum | 324/73 R |
| 4,493,077 | 1/1985 | Agrawal et al. | 371/25 |
| 4,513,283 | 4/1985 | Leininger | 307/455 X |
| 4,535,467 | 8/1985 | Davis et al. | 307/272 R X |
| 4,546,272 | 10/1985 | Suzuki et al. | 307/455 |

OTHER PUBLICATIONS

Canova et al, "LSSD Compatible D-Function Latch", IBM TDB, vol. 25, No. 10, Mar., 1983, pp. 5196-5198.
Blumberg et al, "High-Speed Glitchless Cascade Latch with Set", IBM TDB, vol. 18, No. 5, Oct., 1975, pp. 1415-1416.
Berglund, "Level-Sensitive Scan Design Tests Chips, Boards, System", Electronics vol. 52, No. 6, Mar. 1979, pp. 108-110.

Primary Examiner—Stanley D. Miller
Assistant Examiner—D. R. Hudspeth
Attorney, Agent, or Firm—Charles A. Johnson; Kenneth T. Grace; Marshall M. Truex

[57] ABSTRACT

An economical circuit of n transistors and m resistors (n=4, m=1 for Emitter Coupled Logic (ECL); n=3, m=0 for Current Mode Logic (CML)) interconnects to a fast differential feedback latch of r transistors and s resistors (r=12, s=9 for ECl; r=7, s=3 for CML) using two levels of series gating and one current source in order to establish scan/set testability of such latch. An additional interconnected circuit of v transistors and w resistors (b=2, w−1 for ECL; v=1, w=0 for CML) further establishes either a reset or a set capability for such latch. The economical total scan/set testable latch of x transistors and y resistors (x=18, y=11 for ECL; x=11, y=3 for CML) exhibits an excellent delay-power product since a single current is selectively steered into one of four different paths, the remaining three of which paths are shut down. Use of but a single current source provides further economy of silicon implementation. All such economies are achieved by the trade-off that the scan/set testable latch does exhibit a higher than normal number of combinations of input signal conditions responsively to which the output signals will be indeterminate: some 9 out of a nominal 32 combinations of 5 input signals for which the output states of latches are often specified will produce undetermined signal outputs. Such 9 combinations are, however, essentially unused and never encountered when the scan/set testable latch is implemented and used, as is primarily intended, in gate array technology.

5 Claims, 16 Drawing Figures

TWO RANKS OF SCAN/SET TESTABLE LATCHES

TRUTH TABLE LEGEND

| CHARACTER | DESCRIPTION |
|---|---|
| L | LOW (0) |
| H | HIGH (1) |
| BLANK | DON'T CARE |
| — | NO CHANGE |
| U | UNDETERMINED |

Fig. 6c

| TRUTH TABLE | | | | | | | | |
|---|---|---|---|---|---|---|---|---|
| NUMBER COMB. | IN | | | | | OUT | | NUMBER UNDETERM. |
| | A | B | C | D | E | Q | Q̄ | |
| 4 |   |   | L | L | L | — | — |   |
| 4 |   |   | L | L | H | L | H |   |
| 2 | H |   | H | L | L | H | L |   |
| 2 | L |   | H | L | L | L | H |   |
| 2 |   | H | L | H | L | H | L |   |
| 2 |   | L | L | H | L | L | H |   |
| 1 | H | H | H | H | L | H | L |   |
| 1 | L | L | H | H | L | L | H |   |
| 1 | H | L | H | H | L | U | U | 1 |
| 1 | L | H | H | H | L | U | U | 1 |
| 2 |   | L | L | H | H | L | H |   |
| 2 |   | H | L | H | H | U | U | 2 |
| 2 | L |   | H | L | H | L | H |   |
| 2 | H |   | H | L | H | U | U | 2 |
| 1 | L | L | H | H | H | L | H |   |
| 1 | L | H | H | H | H | U | U | 1 |
| 1 | H | L | H | H | H | U | U | 1 |
| 1 | H | H | H | H | H | U | U | 1 |

Fig. 6d

FAST SCAN/SET TESTABLE LATCH USING TWO LEVELS OF SERIES GATING WITH ONE CURRENT SOURCE

REFERENCE TO RELATED APPLICATIONS

The instant application discloses subject matter also disclosed in another related patent application filed on the same day as the instant application, the other application being further identified as:

U.S. Ser. No. 592,148 entitled FAST SCAN/SET TESTABLE LATCH USING TWO LEVELS OF SERIES GATING WITH TWO CURRENT SOURCES filed in the name of D. F. Berndt.

For the convenience of those who may not have occasion to read the other application, it may be considered to teach a fast scan/set testable latch efficient in power, in number of current sources (one more than the latch of the present invention), in number of electrical components (6 more transistors and 5 more resistors are utilized in the ECL version than in the latch of the present invention) and in area of silicon implementation for ECL or CML cellular gate array structures. The scan/set testable latch of the other application attains its efficiency through a trade-off in operational characteristics, similarly to the manner in which the latch of the instant application will trade off the indeterminacy of outputs in respect of certain combinations of inputs for economy of implementation. The trade-off taken in the scan/set testable latch of other patent application is instead, however, that slow speed of performance in the scan/set test mode should be countenanced in order to allow economy of implementation. Taken jointly, the instant application and the related patent application generally teach that it is possible to consider trade-offs in the economical implementation of scan/set testable latches implemented in ECL or CML cellular gate array structures.

BACKGROUND OF THE INVENTION

The present invention generally concerns a scan/set testable latch constructed in Emitter Coupled Logic (ECL) or Current Mode Logic (CML) cellular gate array structures. The present invention specifically concerns the efficient construction of a scan/set testable latch from cellular gate array structures which are elsewhere utilizable in implementation of other logic macros. This commonality of the cellular gate array structures from which the fast, efficient, and scan/set testable latch of the present invention is constructed is a primary reason that such latch will have two levels of series gating. The present invention will specifically concern a fast scan/set testable latch using two levels of series gating which is efficient of implementation by virtue of being powered with one (only) current source, such creates efficiencies in silicon implementation. Such efficient implementation, and utilization of one only current source, will be obtained in the latch of the present invention because it will have a minimal number of indeterminate output states in respect of certain combinations of inputs, which combinations of inputs will, however, not be encountered when the latch is connected, as is intended, exclusively to logic macros likewise implemented in cellular gate array technology.

The purpose of the present invention is to provide a fast, efficiently implementable, scan/set testable latch circuit constructed of common cellular gate array structures used in digital logics, such as the logics of high performance central processing units. It is known in the prior art that such a latch should be fast in order to allow the logical functions implemented thereby such latch to transpire with maximum speed. It is further known that, because of the fact that approximately 30 to 50 percent of some digital logic designs, such as those of central processing units, are involved in latches and their supporting scan/set circuits, such latches should be efficient of implementation, utilizing a minimum of silicon area and a minimum of power.

The fast ECL/CML latch of the present invention is scan/set testable, and, indeed, may be considered to derive some of its efficiencies of implementation by the manner in which scan/set testing is performed by such latch. Scan/set testing is a well known prior art means of testing increasingly complex digital logics with their attendant increasingly difficult problem of thorough testing. As the gate-to-I/O pin ratio has continued to increase with new technologies, the ability to control and observe internal nodes of digital logic circuits has continued to decrease. Where the ratio of logic gates to I/O pins is large, as in very large scale integrated gate array technology, the utilization of the scan/set test technique greatly increases the testability of a logic circuit, allowing nearly 100% coverage of the contained gates. The scan/set test technique allows the internal registers of the circuit under test to be used as virtual I/O pins, thus reducing the logic gate-to-I/O pin ratio. This has the advantage of increasing the controllability of the digital logic circuit under test. The use of the scan/set test technique eliminates the requirement for manual generation of test vectors for digital logic circuitry. Manual generation of test vectors is very undesirable because of the excessive amount of designer time required, and because of the potential inadequacy of test coverage.

Scan/set testability in accordance with the prior art and with the present invention is implemented by the utilization of flip-flops, or latches, which have two data inputs: a parallel data input for normal operation and a serial data input for scan/set test operation. The selection between the two data inputs, between normal and scan/set data, is controlled by the distribution either of functional clock signals which do enable the usage of normal data (called System Mode of Operation), or by both scan/set clock plus scan/set test enablement signals which do enable the usage of scan/set data. The use of scan/set testable flip-flops, or latches, provides two major advantages. The first advantage is to allow the utilization of such flip-flops, or latches, during normal operation of the digital logic circuitry as latches or, combinatorially, as a functional register. The second advantage is to allow information to be shifted into the flip-flop (providing controllability) as well as allowing retrieval of information from the flip-flops (providing observability). The input function is termed "set" while the output shift is termed "scan". Both operations can be performed at once if the data to be input for the next test step may be anticipated while the output of the present step is being examined.

A scan/set testable flip-flop, or latch, functions in two modes under the control of separate system clock, or a scan/set test clock plus a scan/set test enablement. The two modes of operation are commonly called the System Mode and the Scan/Set Test Mode. In the Scan/Set Test Mode, the latch is used for the testing and maintenance of digital circuits, including Very Large Scale Integrated (VLSI) or Ultra Large Scale Integrated (ULSI) circuits. The same performance of the latch is not normally required, but within the prior art is normally offered, in the Scan/Set Test Mode as in the System Mode. Conversely, and more importantly, the performance of the latch in System Mode is often considerably less than would be obtained by a latch not incorporating scan/set testability because of the very inclusion of such testability, which will later be seen to add, within the prior art, either delay in series gating the latch and/or considerable extra capacitive load to the latch.

The present invention is implemented in gate array technology from common cellular gate array structures. The prior art gate array is a general utility chip design providing complete but unconnected multi-transistor cells, arranged in a regular matrix. The gate array leaves the interconnection of its transistors undefined, such interconnection to be determined at function design time by each designer, usually working with predefined functions on "books", and implemented in the mask levels which deposit the metallization layer interconnects. The argument for the gate array is that a gross reduction in lead time and cost may be obtained where a custom design is not feasible or cannot be justified on the basis of performance or size. The "internal" cell types are typically arranged in immediately abutting locations, in rows separated vertically by routing channels reserved for horizontal metal runs. Connection of the cell to the horizontal metal routes is achieved with polysilicon or metal routes that are part of the basic cell design projecting out into the horizontal channels. All internal cells are identical, and are within themselves laid out so that the specified number of interconnect paths may cross through them in the vertical direction. There is also a vertical routing channel on either end of the rows. The chip is personalized by etching connect points and laying down horizontal and then vertical metalization routes.

For gate array applications, a common cellular array construction consisting of a fixed set of electrical components, called a cell, must be used to efficiently implement various simple functions, such as NAND gates and invertors, as well as the scan/set testable latch function. A minimum cluster of components and/or interconnect that might be used in gate array technology to perform a logic function may be called a quarter cell. Such a quarter cell might typically minimally consist of nine transistors, five emitter followers, four inter-macro pull-down resistors, two level shifter pull-down resistors, two swing resistors, one TEE resistor, one glitch resistor, and one current source resistor. Other combinations are possible, such as stick layouts consisting of a few transistors and resistors per minimum building block. The macros or books are typically of fixed height and variable width. Each macro or book consist of one to many stocks or basic building blocks.

The pertinent concept is merely that the construction of a scan/set latch in gate array technology should be efficient in the utilization of those common cellular array structures which are elsewhere utilizable for the implementation of other primitive digital functions. For all such primitive functions, including the scan/set latch, the gate array interconnect is further used to connect these primitive functions into larger constructions, such as scan/set testable flip-flop pairs, and subsequently into macro functions like counters, registers, decoders, comparators, etc. Such macro functions called "books" constitute the "library" for an individual gate array type. Around the periphery of the gate array are located other cell types which are used for input/output, clock, or power regulation. The book in the library of a gate array are those functions which the gate array designer thought would be useful, and have been designed in anticipation of use. Libraries are augmented as users develop needs for other functions.

So recognizing that the prior art common cellular gate array structures, which common cellular gate array structures are utilized to implement the fast scan/set testable latch of the present invention, needs also be utilized to efficiently implement other combinatorial logic macros, the prior art implementation of scan/setable latches which utilize available components in too formal an emulation of the standard, logical-specification- type, bullet and shield representation of a scan/set testable latch. In other words, the controllable gating of scan/set test data onto a latch, thus making such latch scan/set testable, is normally logically represented by various combinations of AND, OR, and NOR gates occurring by various combinations of AND, OR, and NOR gates occurring in front of such latch. Particularly in the case of series gating, these equivalent AND, OR and NOR logic gate representations do not necessarily represent the equivalent gate delays. The logic designer who starts to implement his/her scan/set testable latch in emulation thereof such AND,OR and NOR logical functions is precluding himself/herself from identifying the most efficient overall implementation of a scan/set testable latch by failing to take a totally integrated view of the entire structure. In other words, the traditional and standard mode of logical representation by bullets and shields is an obstacle to envisioning the integrated construction of a scan/set testable latch.

In particular, one prior art implementation of a scan/set testable latch slavishly imitates the two levels of series gating which do allow scan/set or system data to be applied to such latch, and thus requires three current sources in implementation. In recognition that three current sources are not desirable on the grounds of efficiency in silicon implementation, another prior art scan/set testable latch has been implemented with but a single current source but which such scan/set testable latch then uses three levels of series gating. Such three levels of series gating, if implemented in gate array technology, must be accomplished with those identical common cellular gate array structures which needs elsewise be utilized for combinatorial logic macros. But very few, or none, of such macros require so many as three levels of series gating. Thus, the solution of the multiple current source inefficiency in the prior art by reversion to a scan/set testable latch circuit utilizing three levels of series gating is a poor solution. Some sort of comprehensive approach to the efficient implementation of a scan/set testable latch, such approach as is taken in consideration of speed of operation in gate delays and in consideration of silicon efficiency, as opposed to being guided by too rigorous a replication of the (arbitrary) logical standard representation thereof such scan/set testable latch, is seemingly called for.

SUMMARY OF THE INVENTION

The present invention is a scan/set testable latch circuit constructed in Emitter Coupled Logic (ECL) or Current Mode Logic (CML), which latch efficiently utilizes a minimum amount of silicon area. The scan/set testable latch circuit is particularly suitable for implementation in cellular gate array technology, and for use within Large Scale Integrated (LSI) or Very Large Scale Integrated (VLSI), or Ultra Large Scale Integrated (ULSI) circuits.

The scan/set testable latch circuit of the present invention, whether implemented in ECL or CML, utilizes two levels of series gating. Two levels of series gating appears optimal when the latch of the present invention is constructed, as is the case in the preferred embodiment implementation thereof such latch, from common cellular gate array structures which are also utilized in implementation of other combinatorial logic macros, such logic macros as seldom require more than two series gated levels Two levels of series gating also gives the best delay-power product for the scan/set testable latch. Three levels of series gating would require higher voltage for operation and the necessity of generating and distributing the additional reference voltage.

Operating with two series gating levels, the number of current sources required to implement the scan/set testable latch of the present invention is a figure of merit thereof such latch. The present invention of a scan/set testable latch with two levels of series gating is implementable with one (only) current source. Since the number of current sources utilized in the latch needs be distributed within the gate array structure, the latch of the present invention utilizing only one current source is efficient of implementation in silicon.

The method by which the present invention achieves its efficiency of implementation is that the scan/set testable latch of the invention is that (1) the latch does not have and "AND" condition on the system clock and the system enable, and, more importantly, that (2) the signal output of the latch will be undetermined for a larger number of (deterministic) combinations of input conditions than is typical for a ubiquitous and general purpose scan/set testable latch, such as one sold upon the general components' market to myriad users. Specifically, a scan/set testable latch receiving the five input signals of system data, system clock, scan/set data, scan/set clock, and either set or reset, is commonly evaluated for the signal output conditions arising upon some $2^5 = 32$ specific combinations of such input signals (some of which combinations really represent plural input conditions, being that the state of some input signals may be irrelevant, or "don't care", in the determination of the latch output conditions). For point of comparison, the scan/set testable latch of the related patent application U.S. Ser. No. 592,148 receiving seven input signals exhibits determined signal outputs upon all of the nominal $2^7 = 128$ total combinations of input signal conditions. The scan/set testable latch of the present invention receiving five input signals, exhibits undetermined outputs for some 9 of the nominal 32 specific combinations of input signals. For the output to be undetermined really means not that the output is not casual from, and repeatedly fixable by, each of these 9 combinations of input signals, but rather that the signal outputs of the scan/set testable latch of the present invention will be midway between the high and low levels, such midway signal outputs as are neither usable nor even intended to be created or used.

The combinations of input signal conditions to which the scan/set testable latch of the present invention does not render determined signal outputs are believed to be of little or no utility to actual, in circuit, operation of the latch. Specifically, the undetermined latch output conditions are typically not a problem for the logic designer. The logic designer typically only wishes to have one of the following active at a time: system clock, scan/set clock, and reset. To have the system clock and scan/set clock active at the same time-one of the combinations which produces undetermined signal outputs-would be meaningless at the system level since one cannot be attempting to set the latch with conflicting system data and scan/set data. Therefore, these limitations to the latch do not pose a real problem: undetermined states can easily be avoided through proper system logic design.

Describing the scan/set testable latch of the present invention by what it is, it may be considered a circuit interconnected to, and integrated with, a prior art feedback latch (not of itself scan/set testable) employing two levels of series gating and one current source, such interconnected circuit plus such prior art latch providing, in aggregate, a scan/set testable latch. Such a circuit adding scan/set testability is interconnected to such prior art latch by collector dotted connection to the set Q and clear $\overline{Q}$ signal outputs thereof such latch, and also to the (constant) current source thereof such latch. The interconnected circuit serves, through such connections, to set and clear the latch responsively to enabled and clocked scan/set test data. The particular interconnected cicruit which accomplishes this setting or clearing of the latch in accordance with the scan/set test data does itself employ two levels of series gating, and utilizes the selfsame single current source as does the latch.

The particular interconnected circuit first consists of one-half, nominally the inverting one-half, of a fast series gating level current switch. This one-half of a first series gating level current switch is interoperative, or interactive, with the opposite one-half, the non-inverting one-half, of that current switch which already exists within the first series gating level of the prior art latch. That current switch already within the latch, which current switch is responsive to the system clock signal, will not simultaneously (lest indeterminancy result) be steering current through the inverting one-half thereof upon such times as the inverting one-half of the interconnected circuit, responsive to the scan/set clock signal, is steering current through itself: such is the simple meaning that certain input signals, herein the system clock and the scan/set clock, should not in combination simultaneously be true lest undetermined outputs result. Thus, in the first part, which when abstracted by itself is but a simple gating circuit, the interconnected circuit presents one-half of a first series gating level current switch which, in interoperative combination with a one-half of a first series gating level current switch already existing within the feedback latch, becomes an entire current switch, which may be called the first current switch. Such a first current switch, preferably a differential current switch, is responsive to the binary state of a received scan/set clock signal either (1) to gate current to a next connected, second series gating level, second current switch, or else to (2) not to gate current to such next second current switch but rather to do naught, presenting but a small impedance to, and remaining totally non-interfering with, that current switch already existing within the latch.

The particular interconnected circuit next, second, connected consists of a second current switch, preferably a differential current switch, connected intermediary the first part inverting one-half of the first series gating level first current switch and each of the set Q and clear $\overline{Q}$ signal outputs of the prior art latch, to which said signal outputs the second current switch is collector dotted. (Collector dotted is the general term meaning wired-AND connection of NPN transistors' collectors or wired-OR connection of PNP transistors' collectors.) Should a current be steered to said second current switch from the first current switch, then such second current switch is responsive to the binary state of a received scan/set data signal for either steering such current to the set Q signal output thereby clearing the latch, or else steering such current to the clear $\overline{Q}$ signal output thereby setting the latch. If the second current switch receives no current from the first current switch, then it does naught to set or to clear the latch, and instead presents but a small (foil) capacitance to each of the set Q and clear $\overline{Q}$ signal outputs, which small capacitance does not appreciably detrimentally affect the speed of operation of the latch. By such first and second ports respectively responsive to the scan/set clock and to the scan/set data signals the circuit of the present invention interconnected with a feedback latch circuit does create a scan/set testable latch circuit.

Furthermore, as an optional enhancement to the circuit of the present invention which is interconnected with a feedback latch, it is possible to expand such circuit in separate variations which do respectively afford a capability to reset the latch, or to set the latch, or both to (upon separate times) reset and set the latch. All such variations essentially incorporate as a newly added third port still another one-half, nominally the inverting one-half, of a first series gating level current switch which is by itself incomplete, but which is again interoperably combined with that exact selfsame opposite one-half, the non-inverting one-half, of that current switch already existing to give rise to an entire current switch. When such combination(s) is (are) made anew, still a further complete first series gating level current switch(es) result, which switch(es) may be called the third (and fourth, etc.) current switch(es). The newly added, inverting, one-half of the current switch so created is connected directly between the sole current source and the set Q signal output of the latch, should reset be implemented, and/or clear $\overline{Q}$ signal output of the latch, should set be implemented. The current switch so created is responsive to the binary state of a received reset (or set, as the case may be) signal for either steering current to the set Q (clear $\overline{Q}$) signal output of the latch sufficient to clear (set) the latch, or else for steering no current to the set Q (clear $\overline{Q}$) signal output of the latch and presenting naught but a small capacitance to such set Q (clear $\overline{Q}$) signal output. Thus the further addition of a third part to the circuit of the present invention does allow of the reset (or set) of the latch, which reset (or set) capability is of utility (but not necessity) in the initialization of scan/set testing.

In performance, the latch of the present invention remains fast even though scan/set testability is added by an interconnected circuit. The combination settable (or resettable) latch with interconnected circuit, forming thereby a complete initializable scan/set testable latch is economical of components, utilizing but 18 transistors and 11 resistors in the ECL implementation and but 11 transistors and 3 resistors in the CML implementation. The latch exhibits an excellent delay-power product since a single current is selectively stored into one of four different paths, the remaining three of which paths are shut down. Use of but a single current source provides further economy of silicon implementation. All such economies are achieved by the trade-off that the scan/set testable latch does exhibit a higher than normal number of combinations of input signal conditions responsively to which the output signals will be indeterminate: some 9 out of a nominal 32 conbinations of input signals for which the output states of latches are often specified will produce undetermined signal outputs. Such 9 combinations are, however, essentially unused and never encountered when the scan/set testable latch is implemented and used, as is primarily intended, in gate array technology.

There are additional, subsidiary, features, which features are normal of inclusion in prior art scan/set testable latches, incorporated within the latch of the present invention. Provision is made in the scan/set testable for support of a multi-phase clock system wherein four or more phases are used in the system data path while only two phases are used in the scan/set path. Furthermore, the preferred embodiment scan/set testable latch of the present invention is preferably constructed in versions with either a set, or a reset, function. Both functions are normally not simultaneously implemented in order to save components: system designers normally require only one such function so that the scan/set chain may be initialized with an alternate pattern of "1's", or "0's", respectively as the latch version does either enable the set, or the reset, function. It is possible, if desired, to incorporate both the set and the reset function in one scan/set testable latch. Finally, the scan/set testable latch of the present invention provides both true (Q) and compliment ($\overline{Q}$) signal outputs, both signal outputs which are normally desired by systems designers. Such additional and subsidiary features merely mean that the scan/set testable latch of the present invention is well-balanced, and is not denuded. of useful accommodations to real-world system usage merely in order to be fast and/or efficient.

Correspondingly, it is the first object of the present invention that a fast scan/set testable latch should be constructable from common cellular array structures which are elsewise effectively utilizable in the implementation of other combinatorial logic macros in gate array technology. In particular, this means that the scan/set testable latch of the present invention will utilize two (only) levels of series gating. Such two levels of series gating is reflective of a common cellular gate array structure which is more readily, and commonly, utilizable in the creation of standard combinatorial logic macros than would be any gate array structure which incorporates three or more levels of series gating. For example, the minimum building block of the preferred embodiment scan/set testable latch of the present invention is called a quarter cell, and consists of nine transistors, five emitter followers, four intermacro pull-down resistors, two level shifter pull-down resistors, two swing resistors, one TEE resistor, one glitch resistor, and one current source resistor. Although the contents of such a common cellular gate array structural building block are arbitrary, it needs be kept in mind that such building block should be suitable for the efficient implementation of combinatorial logic macros as well as the present invention of a scan/set testable latch. Such efficient utilization of this "quarter cell" building block, and like common cellular gate array structural building blocks, quickly dictates that a maximum of two levels of series gating should be employed. Precisely two levels of series gating is a characteristic of the scan/set testable latch of the present invention.

It is a second object of the present invention that, having fixed upon two levels of series gating which gives a good delay-power product and which is implementable with common cellular gate array structures elsewise utilizable for combinatorial logics, that the scan/set testable latch of the present invention should exhibit a high figure of merit by utilizing minimal numbers of current sources. Each current source utilized requires generation and requires the silicon area for distribution to the latch. Sinces latches are exceptionally common in large digital logic designs, often comprising from thirty to fifty percent of all logic, minimal utilization of current sources with the attendant efficiency of silicon implementation is important. The present invention will show the implementation of a fast scan/set testable latch with one (only) current source.

It is a third object of the present invention, realization of which object essentially allows the attainment of the first two objects, that indeterminancy of signal outputs in response to certain combinations of signal inputs to the scan/set testable latch of the present invention shouldl outputs in response to certain combinations of signal inputs to the scan/set testable latch of the present invention should be traded off for economy of silicon implementation. The method by which the present invention is able to utilize one only current source is that indeterminancy of latch output signals in response to certain latch input signals will be countenanced in order to achieve efficiency of silicon implementation. In particular, a primary current source will be steered into four different series gating paths, only one of which series gating paths is normally enabled (responsively to certain input signals) while three of such series gating paths are turned-off (responsively to certain other input signals). This operation of one path enabled for current steering while three paths consume less power gives the scan/set testable latch of the present invention an excellent delay-power product: the price being that the input signals needs be managed so that plural paths within the latch are not simultaneously active (thereby producing undetermined and unusable signal outputs).

BRIEF DESCRIPTION OF THE DRAWINGS

FIG. 4b shows the circuit schematic of one prior art scan/set testable latch, which latch by selectively gating system data or scan/set data onto a standard (series gated) latch does implement by substantial mimicry the logic function shown in FIG. 4a.

FIG. 5b shows the schematic representation of a prior art latch circuit using three levels of series gating ECL with a single circuit source in implementation of the logic representation of FIG. 5a.

FIG. 6b shows a second logic representation of the scan/set testable latch circuit of the present invention, which logical representation is relatively more detailed than that of FIG. 6a.

FIG. 6c and FIG. 6d respectively show the truth table legend, and the truth table, which describe the operation of the scan/set testable latch circuit of the present invention, input and output letter designations within such FIG. 6d truth table referencing the correspondingly designated signal ports within the logic diagram of FIG. 6b and within the schematic diagrams of FIGS. 6e and 6f.

DESCRIPTION OF THE PREFERRED EMBODIMENT

Figure 1:
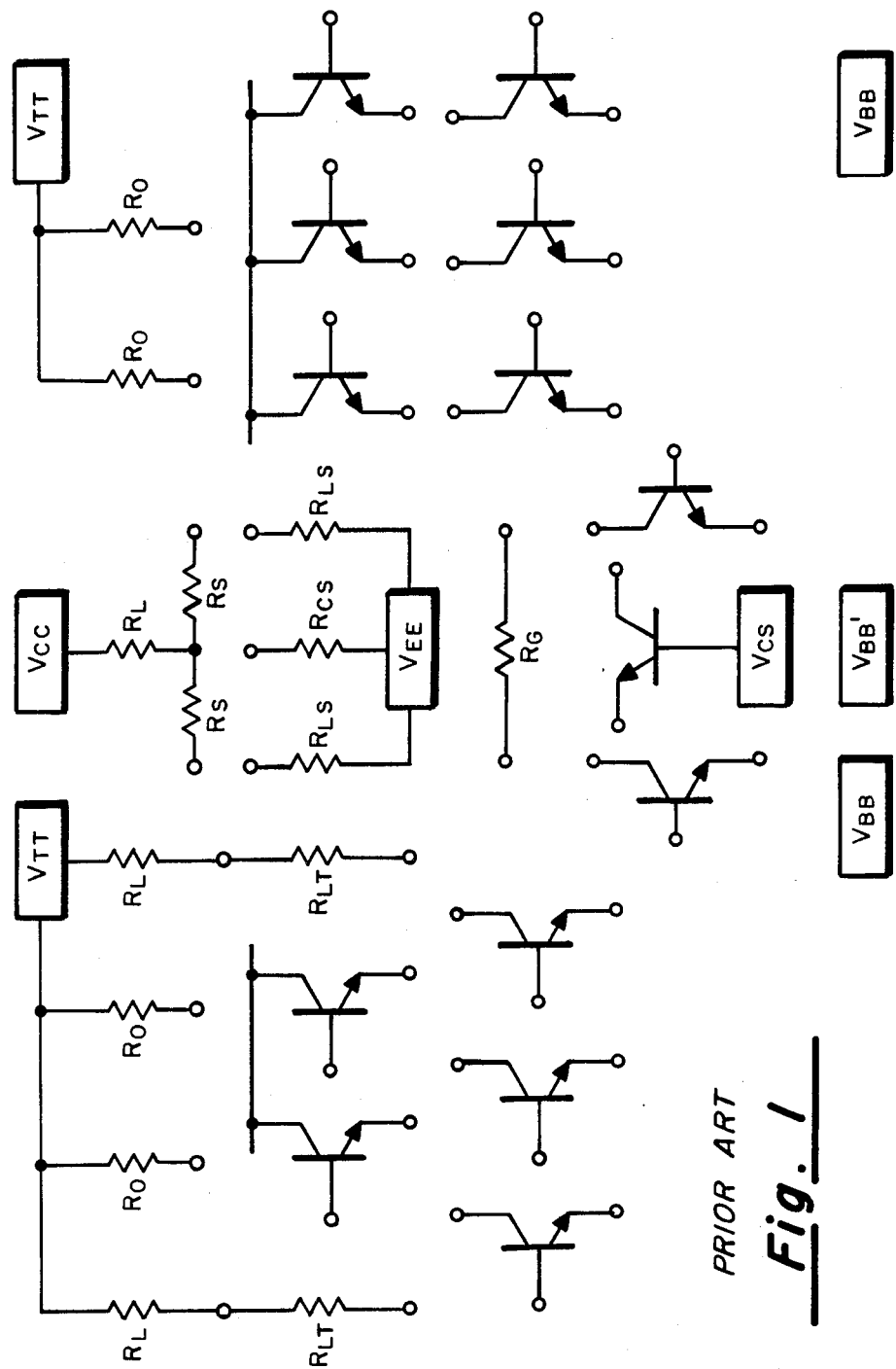
FIG. 1 shows a schematic representation of a prior art internal quarter cell, being a cellular building block in gate array technology.

The present invention is a fast scan/set testable latch employing two levels of series gating which minimizes power, current sources, devices, and silicon area of ECL or CML cellular gate array structures (Bipolar Integrated Circuits) which are utilized in implementation of the scan/set testable latch.

The purpose of the invention is to provide a fast scan/set testable latch circuit implemented in gate arrays, particularly for high performance Central Processing Units (CPU's). Because of the fact that about 30 to 50 percent of the CPU's logic is involved in latches and the supporting scan/set circuits, there exists a need for an efficient scan/set testable latch. An efficient scan/set testable latch circuit should use a minimum of silicon area, minimum of power, and a maximum of speed.

The scan/set testable latch of the present invention functions in two modes under the control of separate system clock and data and scan/set test clock and data. The two modes of operation will be called the System Mode and the Scan/Set Test Mode. In the System or Normal Mode, the latch functions the same as any high performance CML or ECL latch. In the Scan/Set Test Mode, the latch is used for testing and maintenance of LSI circuits.

The primary goal for the scan/set testable latch of the present invention is to provide a fast latch in the system mode using a minimum of silicon area and a minimum number of current sources. To achieve this goal, a sacrifice, or trade-off, was made. This sacrifice, or trade-off, is that the scan/set testable latch of the present invention exhibits undetermined or indeterminate signal outputs for certain combinations of signal inputs. Undetermined, or indeterminate does not mean that the scan/set testable latch of the present invention will not assume a predictable output state resultantly from such input signal combinations, but only that the output signals so produced will not be at normal logic levels, and are thusly both undetermined as to information content and unusable.

The advantages so gained by such a sacrifice, or trade-off, are as follows. The scan/set testable latch of the present invention uses two levels of series gating and one (only) current source. It is fast in system mode. The ECL preferred embodiment implementation of the invention uses only 18 transistors and 11 resistors. The CML preferred embodiment implementation of the invention uses only 11 transistors and 3 resistors. The latch is constructable from two quarter cells (which will be defined) of a particular gate array, which quarter cells are well-balanced for the implementation of other logic macros (as well as the scan/set testable latch of the present invention). The latch has a good delay-power product.

Before explanation of the particular latch of the present invention, it is useful to understand the requirements and the constraints for the design of a scan/set testable latch for use in LSI and VLSI gate array applications. First, the scan/set testable latch should be constructable from a common cell structure. For gate array applications, a common cellular array structure consisting of a fixed set of electrical components must be used to efficiently implement the scan/set latch function as well as other combinatorial logic macros. Defining terms, gate array is a form of large scale integration with a fixed set of diffusion layers which define a basic cellular array with customization accomplished by unique metal layers. The particular gate array from which the preferred embodiment of the present invention is implemented consists of three metal layers: two for component interconnect and one to carry the supply voltages and ground. The component clusters, called quarter cells, are interconnected in series gated Emitter Coupled Logic (ECL) or Current Mode Logic (CML) structures. Series gating means multiple levels of basic gates (in this case of the present invention two such levels in series) where logic functions can be performed at each level.

Continuing with the definition of terms, the particular gate array from which the ECL embodiment of the present invention is implemented is nominally 10K ECL compatible. It contains internal quarter cells relevant to the present invention, and additionally, cells not relevant to the present invention such as external cells, output emitter followers, and the reference generators to produce the necessary reference voltages for the ECL circuits. The internal cells are interconnected to form logic functions within the gate array. The internal cells can receive either nominal 10K or 100K ECL signals external to the gate array. Circuits formed by internal cells can drive other circuits formed by internal cells and can drive circuits formed by external cells (which external cells are not relevant to the present invention). However, it should be generally understood that all signals leaving the gate array must go through a circuit formed by an external cell. These circuits will drive an output emitter follower which can drive external nominal 10K ECL circuits.

Continuing with the definition of terms, an internal quarter cell is the smallest group of internal components that can be replicated. The components of a prior art internal quarter cell are shown schematically in FIG. 1. Certain components within the internal quarter cell are grouped together to form the gate level macros. A macro is defined as a cluster of components and/or interconnect that is used to perform a logic function.

Expanding on the explanation of the electrical schematic of the internal quarter cell from (two of) which the present invention is implemented and which is shown in FIG. 1, an internal quarter cell consists of the following groups of components:

Nine transistors to be used in the implementation of internal gate macros (term to be defined) which gate macros will be called upper internal switch, lower internal switch, internal current source, and clamp diode.

Five emitter followers (transistors with collectors to ground or $V_{CC}$) to be used in the internal emitter follower, lower internal level shifter, and internal latch network.

Four inter-macro pull-down resistors, $R_O$ of nominal value 621 ohms, to be used with the internal emitter followers.

Two each intra-macro latch pull-down resistors, $R_L$ and $R_{LT}$ of respective nominal values 789 and 1,676 ohms, to be used in the internal latch network.

Two level shifter pull-down resistors, $R_{LS}$ of nominal value 11,978 ohms, to be used in the lower internal level shifter.

Two swing resistors, $R_S$ of nominal value 1,091 ohms, to be used in the upper internal switch.

One TEE resistor, $R_T$ of nominal value 153 ohms, to be used in the upper internal switch.

One current source resistor, $R_{CS}$ of nominal value 742 ohms.

One glitch resistor, $R_G$ of nominal value 39,726 ohms, to be used in the lower internal switch.

The present invention requires more components than are available in a quarter cell; therefore, it is necessary to borrow components of the adjacent quarter cell. However, this borrowing leaves sufficient components in such adjacent quarter cell to build a Rank B (slave) latch similar to FIG. 2b except with a single input, single output, and no reset. Such a combination Rank A and Rank B latches will be shown in FIG. 7. Therefore, the entire Rank A and Rank B scan/set testable latch pair can be built in two of those quarter cell building blocks shown in FIG. 1. Many other standard, building block, cell configurations are possible.

Figure 2A:
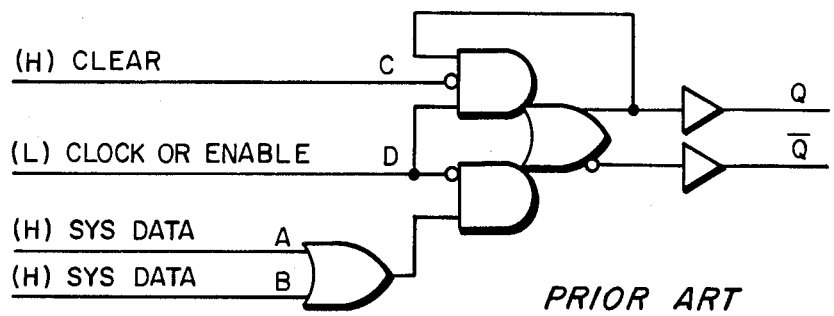
FIG. 2a shows a logical representation of a prior art latch circuit.

The internal quarter cells are utilizable to construct interral gate macros. Rather than merely defining such internal gate macros (which definitions will be useful to understanding the particular circuit of the present invention which, for example, does contain in that appended circuitry which does implement scan/set testability upon a prior art latch a lower internal switch, amongst other internal gate macros), certain pertinent ones are shown, in combination, in FIG. 2b as an example of a (prior art) internal latch (i.e., a latch constructed from internal gate macros). The prior art latch logic function implemented is shown in FIG. 2a. In particular, the following internal gate macros are recognizable in FIG. 2b.

Figure 2B:
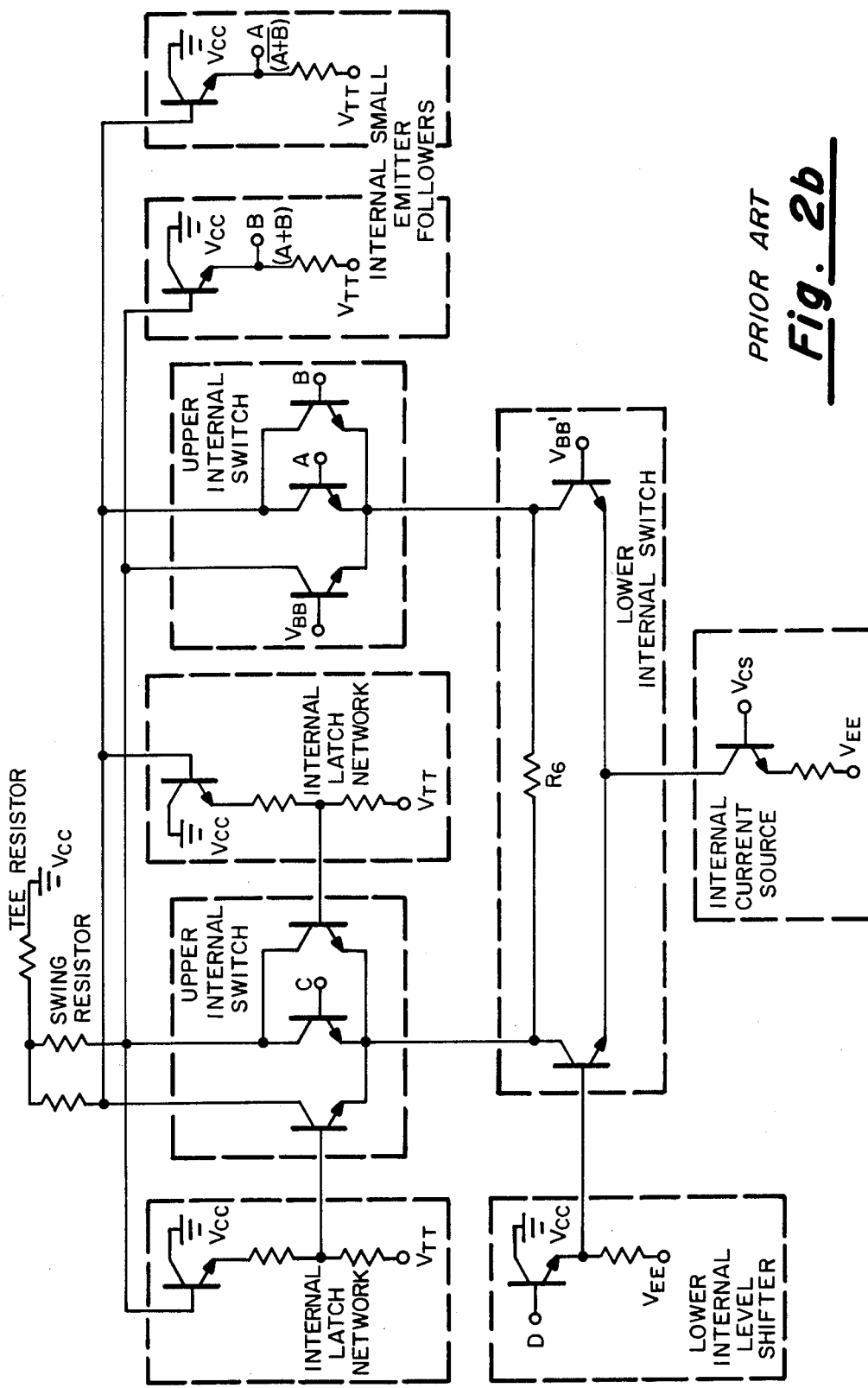
FIG. 2b shows the electrical schematic of the implementation of the prior art latch circuit of FIG. 2a in internal gate array logic macros.

Upper Internal Switch. This current switch consists of up to five current switching transistors. Three transistor upper internal switches are shown in FIG. 2b. The parallel transistors from an OR/NOR with the NOR on the input side.

Lower Internal Switch. This current switch consists of two current switching transistors as shown in FIG. 2b. The lower internal switch forms a positive OR with the upper internal switch.

Internal Glitch Resistor. This is a resistor ($R_G$ in FIG. 2b) used in the lower internal switch to prevent a floating node from drifting to an abnormal potential which would produce an undesirable voltage transient on the output.

Internal Current source. The current source consists of a transistor and a resistor connected between two voltage sources as shown in FIG. 2b to form a constant current source for the upper and lower internal switches.

Internal Latch Network. The internal latch network consists of a transistor and a voltage divider as shown in FIG. 2b. This latch network provides the drive to the upper internal switch in latch networks and provides the correct voltage shift for a reset.

Internal Small Emitter Follower. This is the small emitter follower used to drive the other internal and external cells inside the boundaries of a circuit such as that latch circuit shown in FIG. 2b. The internal pull-down resistors RO shown in FIG. 2b are used to bias the internal small emitter followers.

Lower Internal Level Shifter. The level shifter consists of one or two transistors in parallel and one or two pull-down resistors that drive the lower internal switch. Only one such transistor and pulldown resistor is utilized in the latch circuit shown in FIG. 2b. The level shifter forms an OR/NOR with the NOR on the input side and shifts the input voltage one diode drop down to the lower internal switch.

Internal Swing resistor. This is the resistor $R_S$ that connects to the collector of an upper or lower switch to generate the low level voltage. (See FIG. 2b.)

TEE Resistor. This is the resistor $R_T$ that connects between the swing resistor and $V_{CC}$ in an internal macro. It generates the voltage for the high level, internal to the gate array. (See FIG. 2b.)

Not utilized in the latch circuit of FIG. 2b, but readily visualizable, the following minor internal gate macro also exists:

Clamp Diodes. These are diodes in parallel with the swing resistor when a collector dot involves more than one current source. Clamp diodes are formed from a transistor which has its base common with its collector.

Continuing now with further requirements and constraints for the design of a scan/set testable latch for use in LSI and VLSI gate array applications, a second such requirement is that high speed be obtained in the system data path. For the present invention, the presence of circuitry interconnected to a basic latch for enabling performance of the scan/set test function is essentially transparent to the performance of the latch in the normal system data path. That is, in the system mode the latch of the present invention functions with essentially the same performance as a prior art latch without the additional, interconnected, circuitry.

Third, speed is not critical in the scan/set path. The latch of the present invention functions, however, with identical speed in the scan/set path to that exhibited during normal system utilization.

Four, separate system and scan/set clock enables are desirable in high performance machines. A separate system clock is desirable so that logic can be removed for the clock fan-out circuits, therefore minimizing clock skew. Often the foil lengths are matched in the clock nets to also minimize skew. System designers prefer an "AND" condition at the input to the latch system clock. The scan/set testable latch of the present invention does not, however, support of an "AND" between the system clock signal and the system enable signal. The scan/set testable latch of the present invention neither receives nor uses either a system or a scan/set enablement signal.

Five, certain undetermined-output logic states may be allowed only so long as the corresponding input logic states for this condition do not actually occur in system operation. The scan/set testable latch of the present invention has several such undetermined or undefined output states, so the impact of any such undeterminedoutput logic states on system operation is an issue in the application of such scan/set testable latch.

Six, support by a scan/set testable latch of a multi-phase clock system is desirable. In high performance systems, often 4 or more phases are used in the system data path while only 2 phases are used in the scan/set path. The scan/set testable latch of the present invention is so operable with a 2 phase scan/set clock. A single phase scan/set clock can be used by building an edge-triggered latch out of the Rank A and Rank B latches. This is done by building Rank B with an inverted scan/set clock phase B relative to phase A and tying the scan/set clock phase A and phase B together. An extra test mode input would be needed for the edge-triggered latch to allow testability of such; testability meaning of the edge-triggered latch itself and not scan/set testability which means testing of VLSI and ULSI circuits using a scan/set scheme.

Seven, system designers prefer to have a scan/set latch macro with a set or reset function. The scan/set testable latch of the present invention will exist in two minor variants, one with a set capability and another with a reset capability. In this way, one can initialize the scan/set chain with an alternate pattern of "1's" and "0's". This alternate pattern is then scanned through the scan/set chain to test for a break in the chain at the gate array or p.c. board test level. It is possible, by using one additional transistor within the preferred embodiment CML implementation, or two additional transistors in the ECL implementation of the invention, to simultaneously implement both the set and reset function.

Eight, system designers prefer a latch with true and complement outputs available. The scan/set testable latch of the present invention so offers both true (set Q) and complement (clear $\overline{Q}$) signal outputs.

Nine, the delay-power product of the latch should be optimized. For comparison purposes, the number of current sources to implement a specific logic function is used as a figure of merit for the different circuit configurations. Minimizing the number of current sources reduces the power yet gives high performance. The number of series gated levels is also used for comparison. Two levels of series gating appears to be a good compromise and gives the best delay-power product for the scan/set testable latch under consideration. Three levels of series gating requires higher voltage for operation and the necessity of generating and distributing the additional reference voltage.

Ten, consideration should be given to the selection of technologies. Since the application for the scan/set testable latch of the present invention is for high speed gate arrays, the scope of the teaching of this specification is limited to ECL and CML circuits. The present invention deals with the circuit configuration, style, and form. Absolute delay numbers are not quoted since this would depend on power, layout, and the particular process used.

Eleven, it is desirable to reduce the number of power supply voltages. Two power supply voltages are used in the circuit of the present invention to improve the delay-power product. One supply voltage can be used if desired. The following are some typical voltages for 2 levels of series gating: For ECL, $V_{TT}=-2$ volts and $V_{EE}=-4.5$ volts. For CML, $V_{TT}=-2$ volts while $V_{EE}=-3.3$ volts.

Now entering into the specification of prior art scan/set testable latches and of comparison of such to the scan/set testable latch of the present invention, it should be preliminarily understood that, for comparison purposes, the various scan/set testable latches are not adequately represented solely by the respective military standard bullet and shield representations. Particularly in the case of series gating, these equivalent gate logic representations do not necessarily represent the equivalent gate delays. Therefore, these logic representations are not useful for performance comparisons. Also, the undefined output states, if any, of the actual physical electronic implementation are not properly indicated by the bullet and shield logic representation (the electronic implementation of the scan/set testable latch of the present invention has undefined output states).

Figure 3:
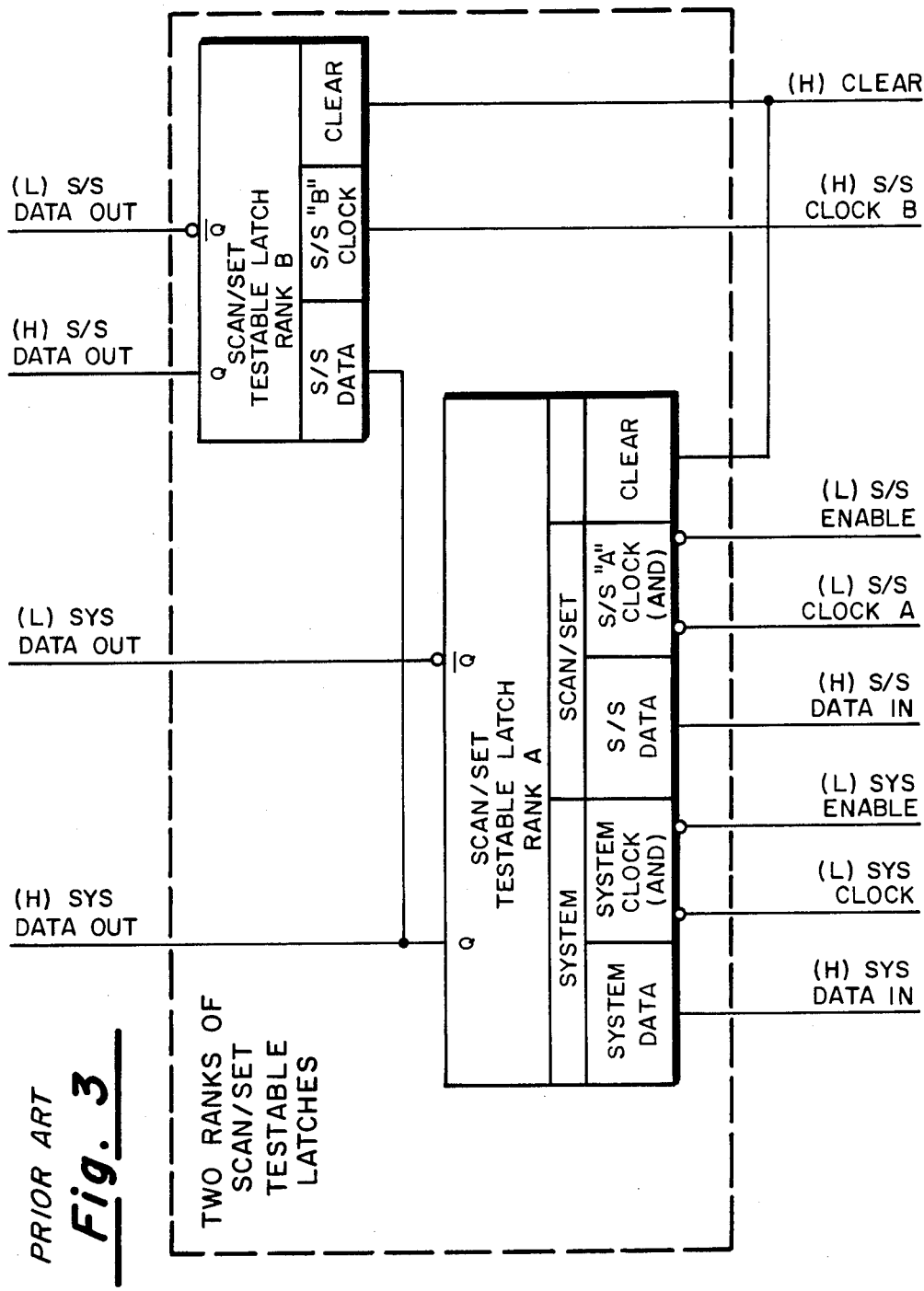
FIG. 3 shows a block diagram of two ranks of scan/set testable latches, which alignment by rank is known in the prior art.

FIG. 3 shows a block diagram of the prior art alignment of two scan/set testable latches. The latches are identified as a Rank A and Rank B latch. Note that the system data output is taken directly off the first Rank A latch and, therefore, gives better performance. The Rank B latch is only in the scan path and, therefore, does not affect system performance. The Rank B latch can be designed with either an active high or low clock using conventional ECL circuits. If the active A clock is low and active and B clock is high, scan clock A and B can be tied together (i.e., clock A and clock B are the identical clock) to form an edge triggered latch for scan/set operation.

The present invention deals only with circuit improvements to the Rank A scan/set testable latch. All the following discussion will refer to the Rank A scan/set testable latch. The interconnection of the Rank A scan/set testable latch of the present invention to a Rank B latch will be shown in FIG. 7.

Figure 4A:
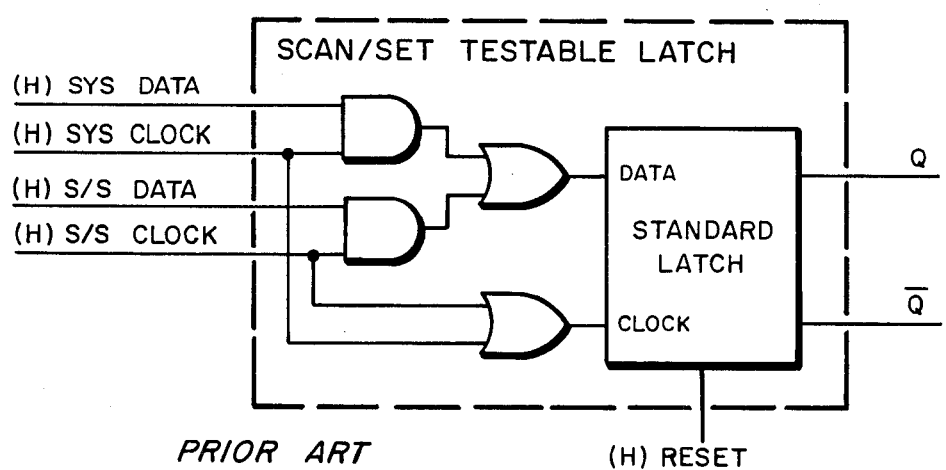
FIG. 4a shows one prior art logical representation of a scan/set testable latch.
Figure 4B:
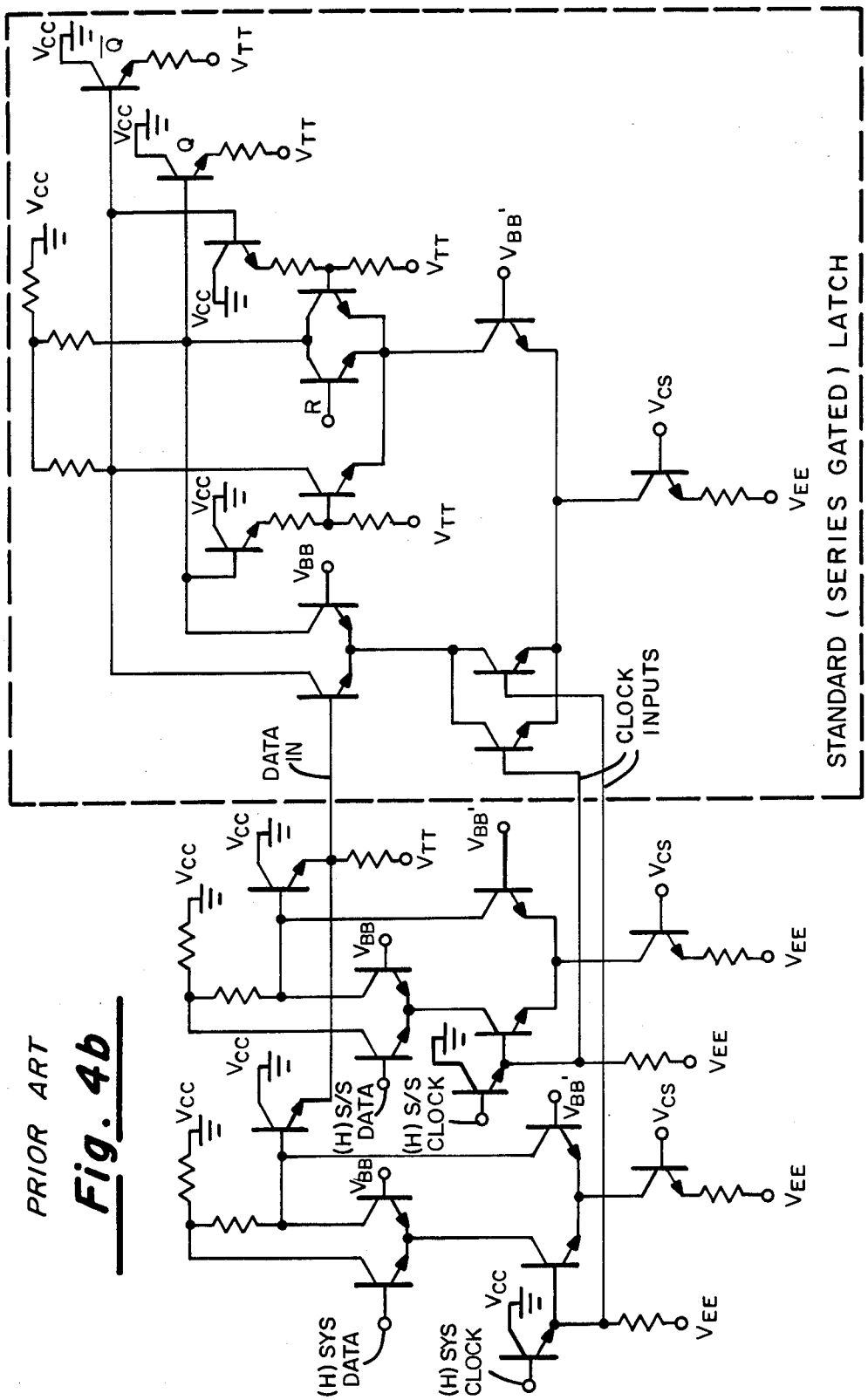

FIG. 4, consisting of FIG. 4a and FIG. 4b, shows a first prior art example for the circuit implementation for the Rank A scan/set testable latch. As is suggested by the bullet and shield logic representation shown in FIG. 4a, in the prior art logic was typically added in front of the latch circuit to effectively gate signals from the system data or scan/set data into the latch. This approach shown in the circuit diagram of FIG. 4b added delay to both the system data path and the scan/set path. Another similar approach would be to place a multiplex circuit in front of the latch, but this would require a common system and scan/set clock.

Figure 5A:
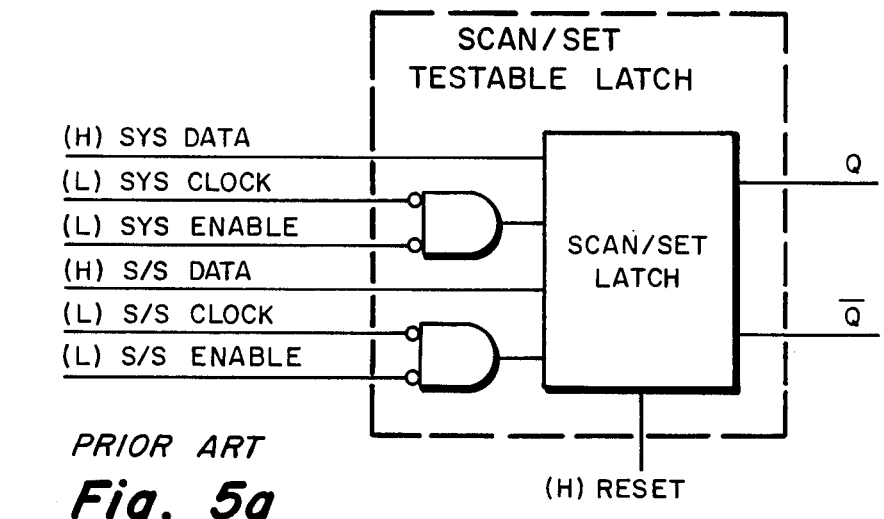
FIG. 5a shows a second prior art logic representation of a scan/set testable latch.
Figure 5B:
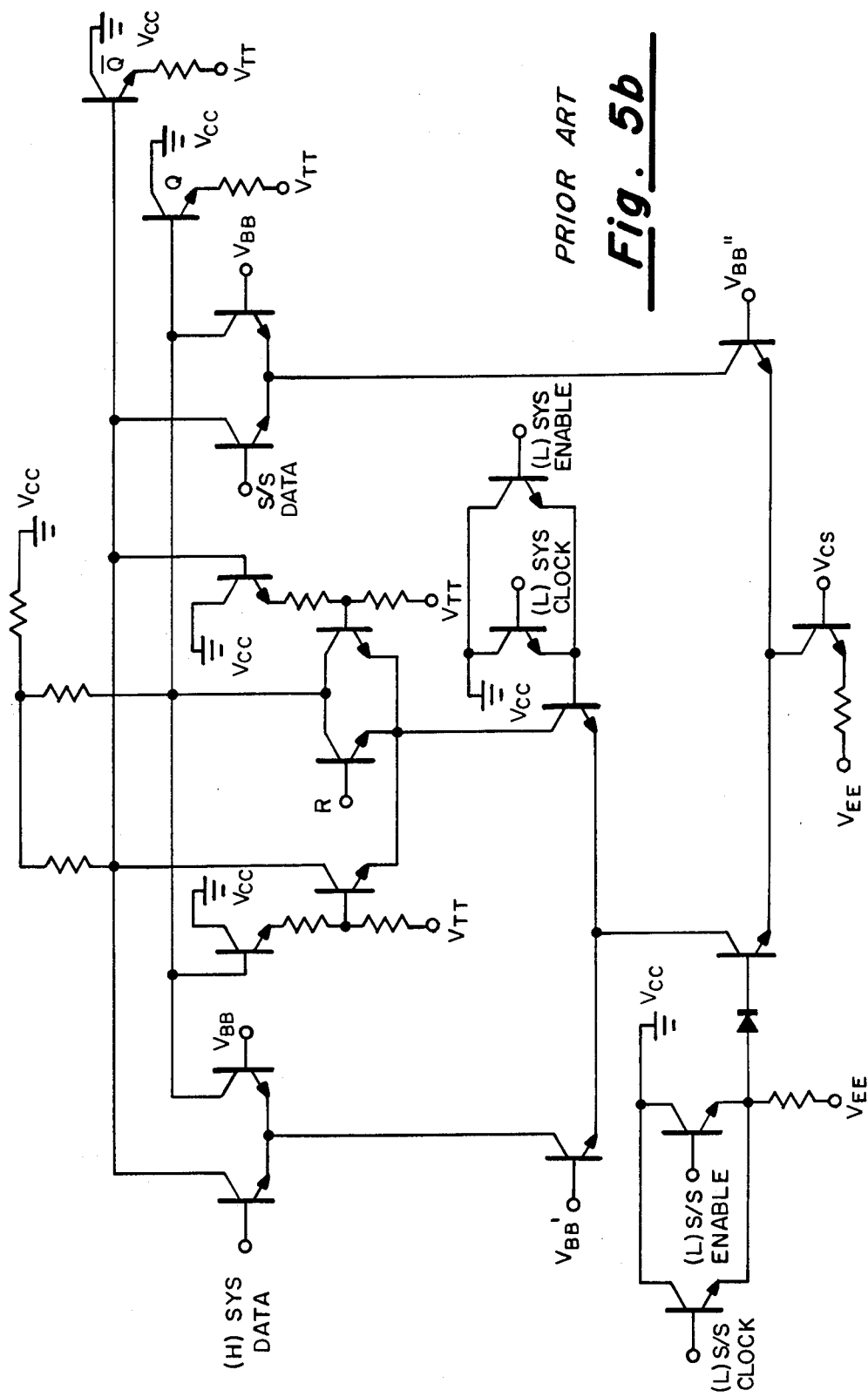

FIG. 5, consisting of FIG. 5a and FIG. 5b, shows a second prior art scan/set testable latch circuit implementation using 3 levels of series gating ECL with a single current source. This circuit functions reasonably fast in the system data path and in the scan/set path but requires 3 levels of series gating to implement. The 3 levels of series gating require a higher $V_{EE}$ voltage and an additional reference voltage ($V_{BB'}$ and $V_{BB''}$ are reference voltages). The 3 levels of series gating may be useful for the implementation of the latch function but would not be frequently used by other combinatorial logic for gate array applications. Therefore, the overall delay-power product for the gate array would not be reduced. The 3 levels of series gating, however, does allow an "AND" condition for system clock and system enable. The preceding general principles also apply to 3 levels of CML latch.

Figure 6A:
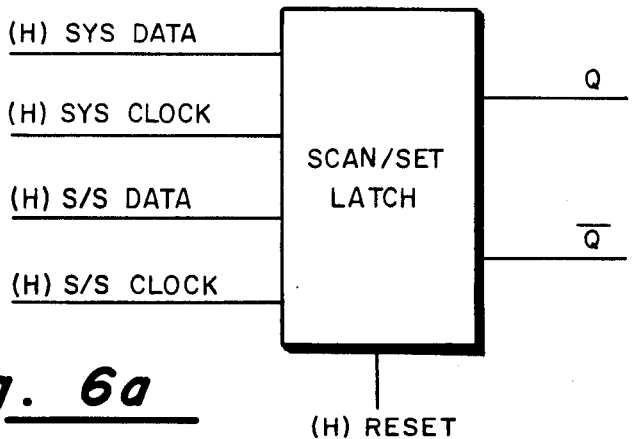
FIG. 6a shows a first, highest level, logic representation of the scan/set testable latch circuit of the present invention.
Figure 6B:
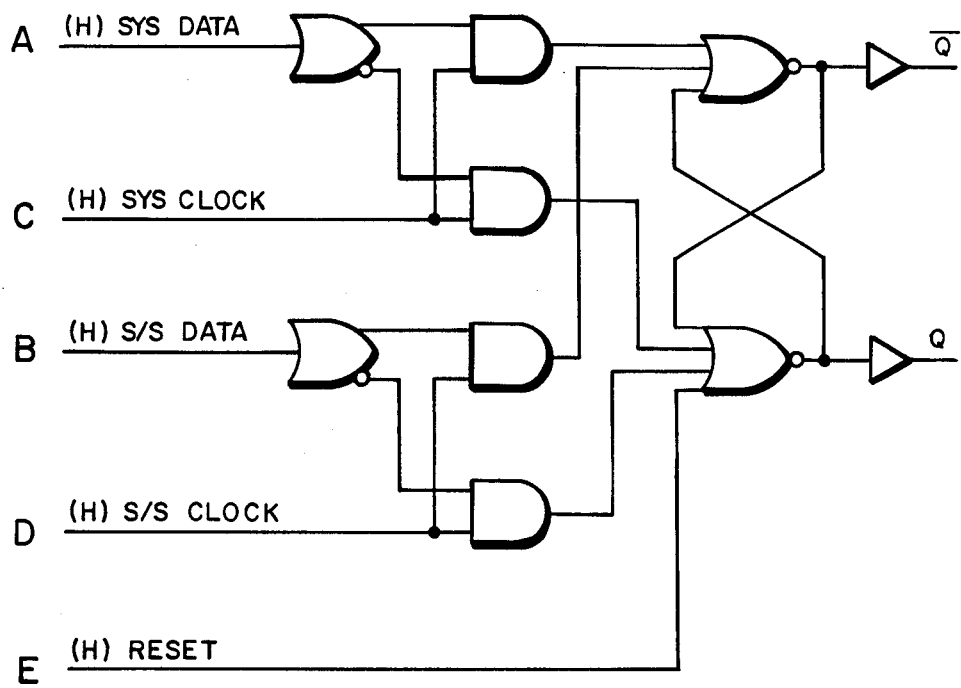

FIG. 6a and FIG. 6b respectively show a crude and somewhat more detailed logic diagram, while FIG. 6c and FIG. 6d respectively show the legend and the truth table for the scan/set testable latch of the present invention using 2 levels of series gating ECL or CML and 1 current source. The same logic diagram and truth table apply to both the ECL or CML versions of the latch. For simplicity, only the reset variant of the logic and truth table are shown. The set variant of the latch would follow in a similar fashion.

Figure 6E:
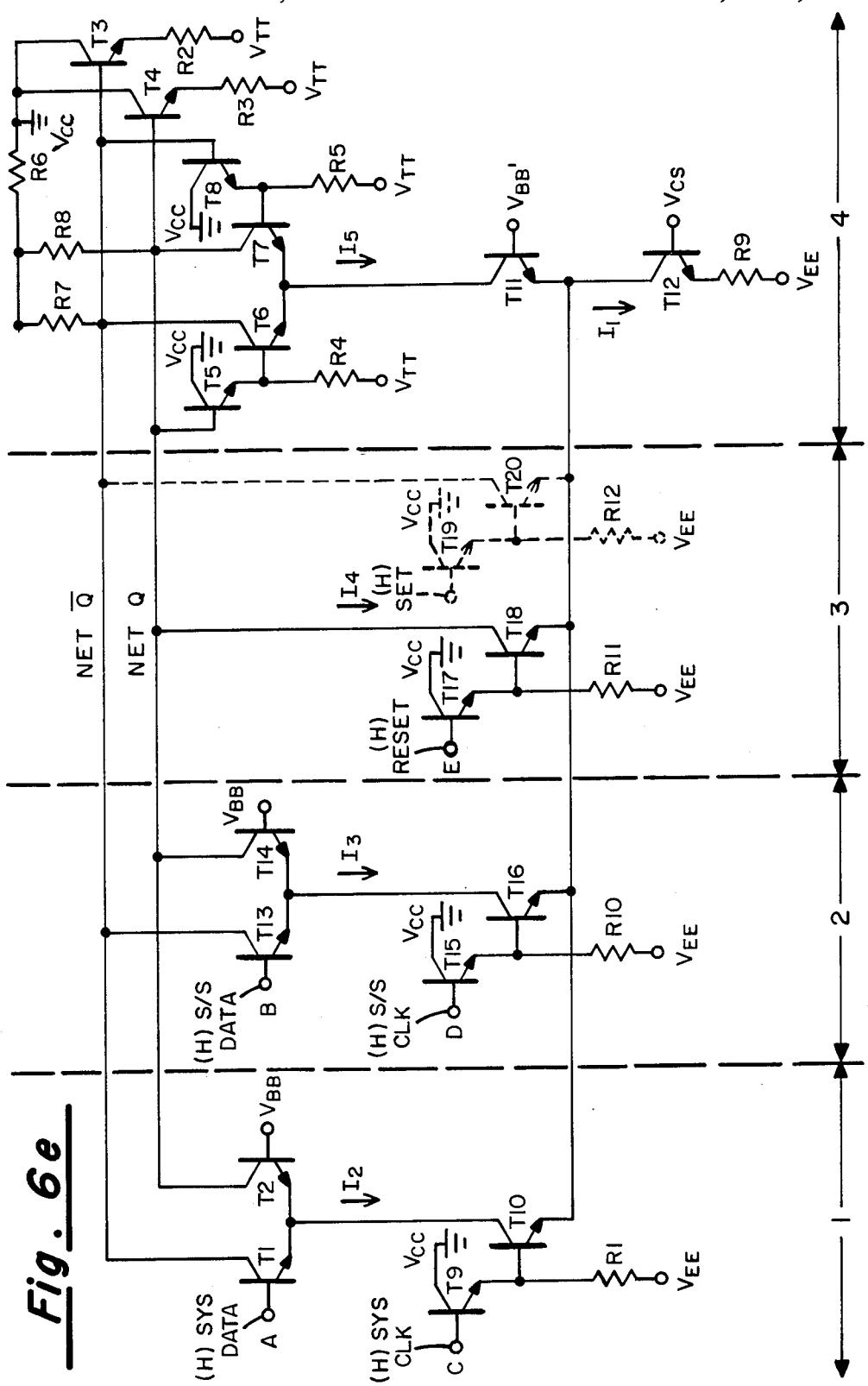
FIG. 6e shows a schematic diagram of the first preferred embodiment implementation of the present invention of a scan/set testable latch when implemented in Emitter Coupled Logic (ECL).

FIG. 6e shows the circuit schematic of the ECL version of the scan/set testable latch of the present invention. This scan/set latch uses 2 levels of series gating ECL and has 1 current source. The latch macro was designed to use the existing components of the gate array cellular structure previously discussed. This same cellular structure is utilizable to implement a large number of other standard, ECL, series gated macros. The present invention relates only, of course, to the implementation of the scan/set testable latch.

Recognizable in FIG. 6e by correspondence to like elements and structures in FIG. 2b, the transistors T1 through T20 would be obtainable from two of the building block standard cells shown in FIG. 1. Further by comparison, resistor R6 is a TEE resistor $R_T$ of nominal value 153 ohms. Further by comparison, resistors R7 and R8 are swing resistors $R_S$ of nominal value 1,091 ohms. Further by comparison, resistors R4 and R5 are inter-macro latch pull-down resistors type $R_L$ of nominal value 1,676 ohms. Further by comparison, resistor R9 is a current source resistor $R_{CS}$ of nominal value 742 ohms. Further by comparison, resistors R1, R10, R11 and R12 are level shifter pull-down resistors $R_{LS}$ of nominal value 11,978 ohms. Finally by comparison, resistors R2 and R3 are inter-macro pull-down resistors $R_O$ of nominal value 621 ohms.

The schematic diagram of the scan/set testable latch of the present invention shown in FIG. 6e is divided left-to-right into four sections 1 through 4. Section 1 and 4 jointly depict a prior art differential feedback latch without scan/set testability; such sections being joinable to create a complete latch circuit without intervening sections 2 and 3. Section 2 depicts the interconnected circuit of the present invention which, when interconnected as indicated to that latch of combined sections 1 and 4 which utilizes two levels of series gating and one current source, does add scan/set testability to such latch, forming in aggregate a scan/set testable latch. Section 3 depicts an optional enhancement interconnected circuit which adds reset capability to the scan/set testable latch shown in combined sections 1, 2, and 4. The dashed line circuit shown within section 3 represents that alternative optional enhancement circuit which would add set capability to the scan/set testable latch.

A prior art and conventional feedback ECL latch, without scan/set teatability is shown within sections 1 and 4 demarked by the dashed lines in FIG. 6e. All latches employ positive feedback via the coupling of active elements: it is by such that they become latches. The latch within sections 1 and 4 of FIG. 6e is a differential feedback latch, the preferred (but not the only) type with which the appended circuits of the invention included in section 2 and section 3 will be interoperative to produce scan/set testability. A differential feedback latch means only that both of the output states of such latch, both the set Q and clear $\overline{Q}$ signal outputs, are simultaneously feed back to influence the state of the latch. Such a differential, dual, feedback normally establishes a latch which is optimally fast to assume either the set or the cleared state.

First is described the prior art conventional differential feedback ECL latch, without scan/set testability, that is shown in sections 1 and 4 of FIG. 6e. The interconnected circuitry within sections 2 and 3 should be considered inactive, and may be ignored. Suppose it is wished to store that data, nominally a binary one (1), represented by the High (H) level of signal (H) SYS DATA into the latch. New system data can be entered into the latch when the active system clock represented by signal (H) SYS CLK is true or High. The High signal (H) SYS CLK is transferred by the level converter consisting of transistor T9 and resistor $R_1$ as a High level to the base of transistor T10. For this condition, the base of transistor T10 is higher than the base of transistor T11 which is referenced to a first series gating voltage reference $V_{BB'}$ (about $-2.1$ v) so transistor T9 turns on. This steers the current $I_1$ to the path $I_2$. At this time, $I_5$ is nearly zero, and the latch feedback is inactive. Therefore, the state of output signals Q and $\overline{Q}$ can easily be changed by the new system data. For example, for system data such that signal (H) SYS DATA is High, then the base of transistor T1 will be higher than the base of transistor T2 which is referenced to a second series gating voltage reference $V_{BB}$ (about $-1.3$ v, and always of lessor magnitude than $V_{BB'}$), and transistor $T_1$ will conduct emplacing net $\overline{Q}$ Low at only the voltage drop across resistors R7 and R6 from ground $V_{CC}$. The latch assumes the set state with output signal $\overline{Q}$ Low and signal Q High. The converse would occur from the conduction of transistor T2 should signal (H) SYS DATA have been a binary zero (0), or Low. Transistors T5 thru T8 are inactive and add only collector capacitance to the Nets Q and $\overline{Q}$ which allows of the high speeds of a conventional ECL latch.

Continuing in FIG. 6e, data is stored in the latch when the system clock (signal (H) SYS CLOCK) goes Low. In this case, I1 is steered in the direction of $I_5$. The differential feedback latch network is then active. If Net Q is higher than Net $\overline{Q}$, the base of transistor T6 will be higher than the base of transistor T7, and transistor T6 will be turned on which will maintain Net $\overline{Q}$ low and Net Q high. The resistors R4 and R5 are part of the differential feedback latch. Transistors T3 and T4 are emitter followers which gives ECL its low output impedance for driving large capacitive nets. Resistors R2 and R3 are pull-down resistors. Transistors T3, T4, T5, T8, and T9 (as well as T15, T17 and T19 to be later discussed) have grounded collectors and function as emitter followers. Resistor R6 is used to reduce the voltage swings for improved performance within the internal cells of the gate array.

Continuing in FIG. 6e, next is described the interconnected circuit within section 2. This interconnected circuit is designed to have a negligible effect on the performance of the ECL latch when the latch is in the system mode while enabling operation in the scan/set test mode (i.e., adding scan/set testability). The interconnected circuit is connected between (1) the source of current $I_1$, supplied by the transistor T12 which is biased by constant voltage $V_{CS}$ (of approximately $-3.2$ volts) and which is connected to the single supply voltage $V_{EE}$ (of approximately $-4.5$ volts) through resistor R9, and (2) a collector dotted connection to each of the set, NET Q, and the clear, NET $\overline{Q}$, signal outputs of the prior art feedback latch. The term "collector dotted" is the general term which means wired AND when the collectors of NPN transistors operating with a negative voltage supply are connected (such as is the case shown in FIGS. 6e and 6f), or wired OR when the collectors of PNP transistors operating with a positive voltage supply are connected.

Continuing with the explanation of the interconnected circuit shown in section B of FIG. 6e, in the system mode the scan/set clock signal (H) S/S CLOCK) is inactive (Low). Transistor T16 is turned off and the current Source $I_1$ is steered either in the direction of $I_2$ or $I_5$ and, therefore, also bypasses the transistors T13 and T14 which are turned off. In this mode, only the small collector capacitance of these transistors T13 and T14 and the foil capacitance is respectively added to the NET Q and NET $\overline{Q}$. The resulting delay is considerably less than the delay that would be encountered if a multiplex circuit or logic gates were placed in front of the scan/set latch. In the scan/set test mode, the scan/set clock signal (signal (H) S/S CLOCK) is true, or High, while the signal system clock signal (signal H) SYS CLOCK) is false or Low. The current $I_1$ from the current source is steered in the directions of $I_3$, making $I_5$ and $I_2$ essentially zero. When current $I_1$ from the current $I_1$ from the current source is steered in the direction of $I_3$, then transistors T13 and T14 act as a differential current switch responsive to signal (H) S/S DATA to either (1) by conduction of transistor T13 switch such current to output NET $\overline{Q}$, emplacing such net at a Low level, or (2) by conduction of transistor T14 switch such current to output net Q emplacing such net at a Low level, respectively setting and clearing the latch as signal (H) S/S DATA is respectively higher or lower than reference voltage $V_{BB}$.

Finally, the interconnected circuit shown in section 3 of FIG. 6e allows, optionally upon inclusion, the enablement of either a reset capability (T17, T18 and R11 shown in solid line) or a set capability (T19, T20 and R12 shown in dashed line) or both capabilities. The reset or set circuit(s) are connected between the current source and the respective signal output nets Q and $\overline{Q}$. Both transistors T10 and T16 are turned off by respective low signals (H) SYS CLK and (H) S/S CLK during a reset or set operation, allowing the High occurrence of signal (H) RESET to be level shifted by transistor T17 and resistor R11 to emplace a signal on the base of transistor T18 which is higher than reference voltage $V_{BB'}$, thereby causing such transistor T18 to conduct current $I_1$ in the path of $I_4$ emplacing output signal net Q at a Low signal level. When signal (H) reset is restored to a false, or Low, condition then the latch becomes cleared via the feedback current $I_5$. The set capability enabled of the inclusion of transistors T19 and T20 plus resistor R12 functions responsively to signal (H) SET to emplace output signal net $\overline{Q}$ at a Low level and to set the latch.

A variation on the set and reset functions shown in section 3 of FIG. 6e would be to incorporate the set and reset function as part of the differential feedback latch, similarily to FIG. 2b. This method of incorporating the set and/or reset function only applies to the ECL case and would require 2 additional resistors RLT but one less emitter follower.

Incorporating the set and/or reset function as part of the differential feedback latch is not recommended in the CML case because of the reduced noise margins. The variation of incorporating the set and/or reset function on the ECL latch of the present invention will be shown in FIG. 7.

In summary of the method of operation, FIG. 6e shows the circuit schematic for a scan/set testable latch using 2 levels of series gated ECL with a single current source. This latch has an extremely good delay-power product since the current source $I_1$ can be steered into 4 different paths—$I_2$, $I_3$, $I_4$, and $I_5$. That is, about ¾ of the logic is shut down and, therefore, consumes less power. Since the entire latch uses a single current source, clamp diodes are not needed. The current $I_1$ can be steered respectively in the direction $I_2$, $I_3$, and $I_4$ when one and only one of the following is true, or High: the system clock signal (H) SYS CLK, the scan/set clock signal (H) S/S CLK, or the reset (set) signal (H) RESET ((H) SET). When system clock, scan/set clock, and reset are all false, or Low, the current $I_1$ is steered in the direction of $I_5$, and the differential feedback latch circuit is active. Data is then stored in the latch based on the last state of Net Q and Net $\overline{Q}$ when inputs C, D, or E changed from the active state (High) to the inactive state (Low). Because of the circuit symmetry, the delay for the system data and scan/set data is equally fast.

Figure 6F:
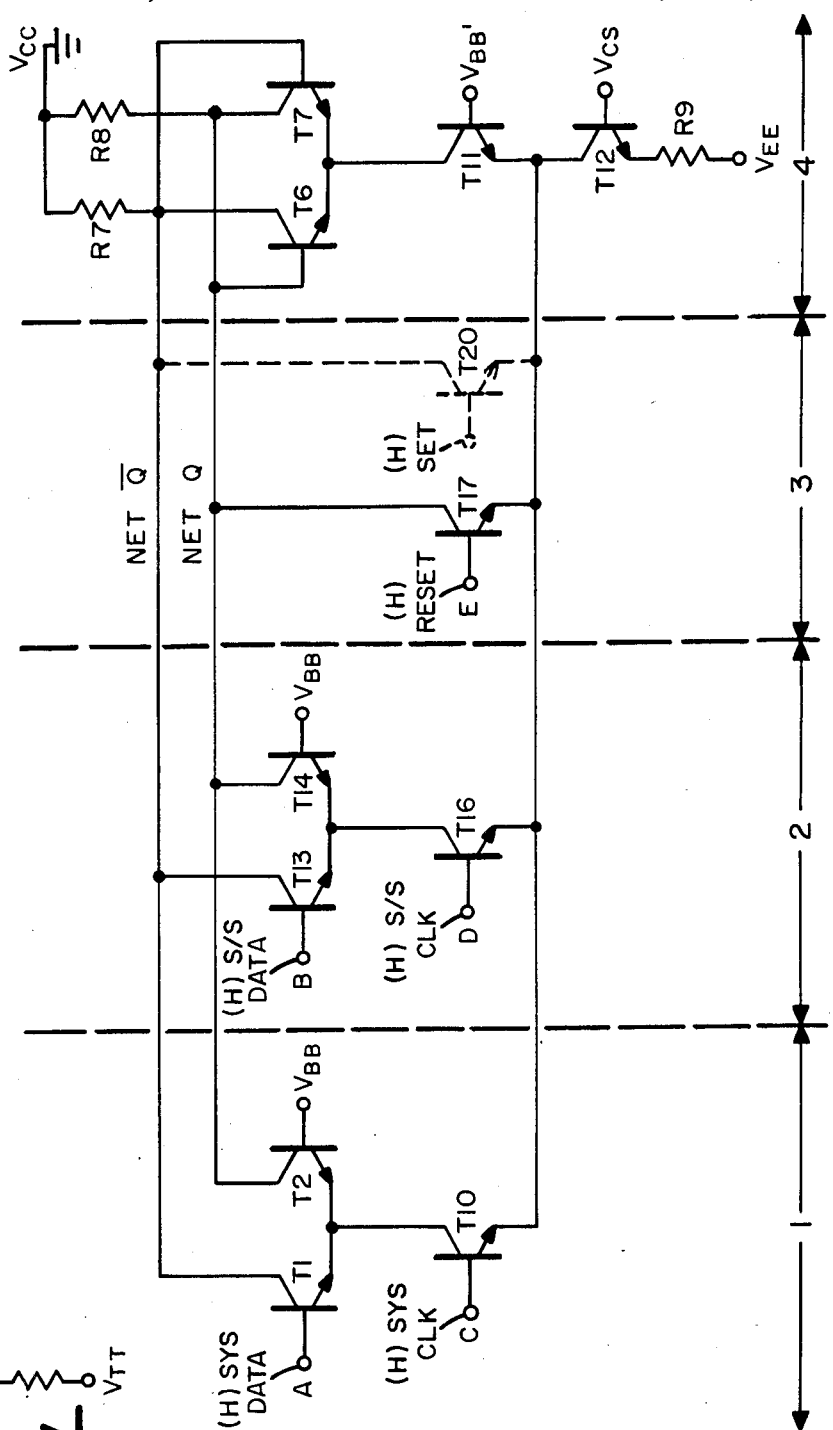
FIG. 6f shows a schematic diagram of a second preferred embodiment implementation of the present invention of a scan/set testable latch when implemented in Current Mode Logic (CML).
Figure 6G:
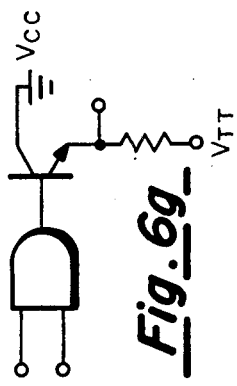
FIG. 6g shows a circuit schematic of a high fan-out emitter follower driver.

FIG. 6f shows the CML enbodiment of the present invention of a scan/set testable latch using 2 levels of series gating with a single current source. The CML version functions in a similar fashion as the ECL version except that all the emitter followers are removed. The emitter followers for inputs C, D, and E are also removed from the latch macro (saving silicon area) and are incorporated as part of the high fan-out drivers since system clock, scan/set clock, and reset are typically high fan-out functions. Placing the emitter followers in the high fan-out drivers gives better performance for driving large interconnect capacitive nets. FIG. 6g shows the circuit schematic of such an emitter follower functioning as part of the high fan-out drivers.

Describing both the ECL and the CML preferred embodiment implementations of the present invention of a scan/set testable latch employing two levels of series gating, it may be noted that the present invention is essentially a circuit apparatus interconnected to, and method applied to, the set Q and clear $\overline{Q}$ signal outputs of a prior art feedback latch (not in of itself scan/set testable) which apparatus and which method thusly renders, in aggregate, such latch to be scan/set testable, ergo a scan/set testable latch. The interconnected circuit apparatus serves, through such connections to the set Q and clear $\overline{Q}$ signal outputs of the prior art feedback latch, to set and clear the latch. The preferred feedback latch is a differential feedback latch. The basic interconnected circuit apparatus of the present invention which accomplishes this setting or clearing of the differential feedback latch in accordance with the scan/set test data does itself employ two levels of series gating, and utilizes the same current source as does the differential feedback latch. The basic interconnected circuit of the present invention firstly consists of a first current switch (preferably a differential current switch) collector dotted connected with each one of the set Q and clear $\overline{Q}$ signal outputs of the differential feedback latch circuit which, when supplied with a current, switches the current in accordance with the binary state of the scan/set data input signal either to set or to clear the latch or which, when not supplied with a current, does naught but present a small (foil) capacitance to the signal outputs of such differential feedback latch circuit (thusly but minutely affecting the normal mode operational speed of such latch). Such a first current switch may be observed as transistors T13 and T14 in each of FIGS. 6e and 6f, and may be identified to be a current switch by comparison to those upper internal switches shown in FIG. 2b. The basic interconnected circuit of the present invention next, secondly, consists of the inverting one-half of a second current switch (preferably a differential current switch) for directing the current from the current source to either the first current switch, in the case of clocked scan/set test, or to the differential feedback latch (thus disabling that any scan/set data should be used by the first current switch to set or to clear the Latch) when scan/set test is not clocked. Such a second current switch may be observed as transistors T16 and T11 in each of FIG. 6e and 6f and may be identified to be a current switch by comparison to that lower internal switch shown in FIG. 2b. Of this second current switch, obviously only transistor T16 is contributed by the interconnected circuit, transistor T11 being part of the (differential) feedback latch. Thus the interconnected circuit may be considered to donate one-half of a current switch, which one-half is interactive, or interoperative, with one-half (the T11 one-half) of a current switch (the T10 and T11 current switch) already existing within the first series gating level (the $V_{BB'}$ level) of the (differential) feedback latch in order, by such interoperative combination, to again form a complete first series gating level current switch (the T16 and T11 current switch).

In the ECL embodiment of the scan/set testable latch of the present invention, the optionally includable transistor T15 and resistor R10 but form a level shifter circuit for the non-inverting level-shifted application of the scan/set clock signal, signal (H) S/S CLK, to the base of transistor T16. This non-inverted application of a fundamental received signal is why the T16 half of the T16 and T11 current switch is normally referred to as the inverting one-half of such current switch. The scan/set clock signal, of the proper magnitude relative to $V_{BB'}$ with which it is differentially compared, could, of course, be applied directly to the current switch of the point of the base of transistor T16. That transistor T15 and resistor R10 constitute a simple level shifter circuit may be identified by reference to FIG. 2b. Note in the ECL and CML case the lower level shifters T9 and R1, T15 and R10, T17 and R11, and T19 and R12 can be removed from the latch and incorporated as part of the high fan out drivers for SYS CLK, S/S CLK, set or reset.

As a further, optional, inclusion to the circuit of the present invention of a scan/set testable latch, it is possible to incorporate an additional interconnected circuit (or circuits) which provide of a reset, or of a set, capability (of both capabilities) to the feedback latch. Similarily to the manner by which the interconnection of a circuit adding scan/set test capability did supply (as transistor T16) one-half of a current switch which interoperably combined with one-half (transistor T11) of a first series gating level current switch already within the feedback latch (the T10 and T11 current switch) to form a new current switch (the T16 and T11 current switch), so also does the interconnected reset (or set) circuit contribute as T18 (or T20) the inverting one-half of a current switch which is interoperative with the non-inverting existing one-half (T11) of a first level-series gating current switch within the latch to form thereby such interoperation a complete first series gating level current switch of transistors T18 and T11 (or T20 and T11). Such a complete current switch is responsive to a reset (or to a set) signal for gating current to the set Q (or clear $\overline{Q}$) output signal nets sufficient to either clear (or set) the latch. Such a complete current switch may be controlled by a reset (or a set) signal which is level shifted in a level shifter consisting of transistor T17 and resistor R11 (or transistor T19 and resistor R12). Normally only a reset or a set additional interconnected circuit is implemented, although both may be incorporated but not simultaneously enabled.

Figure 7:
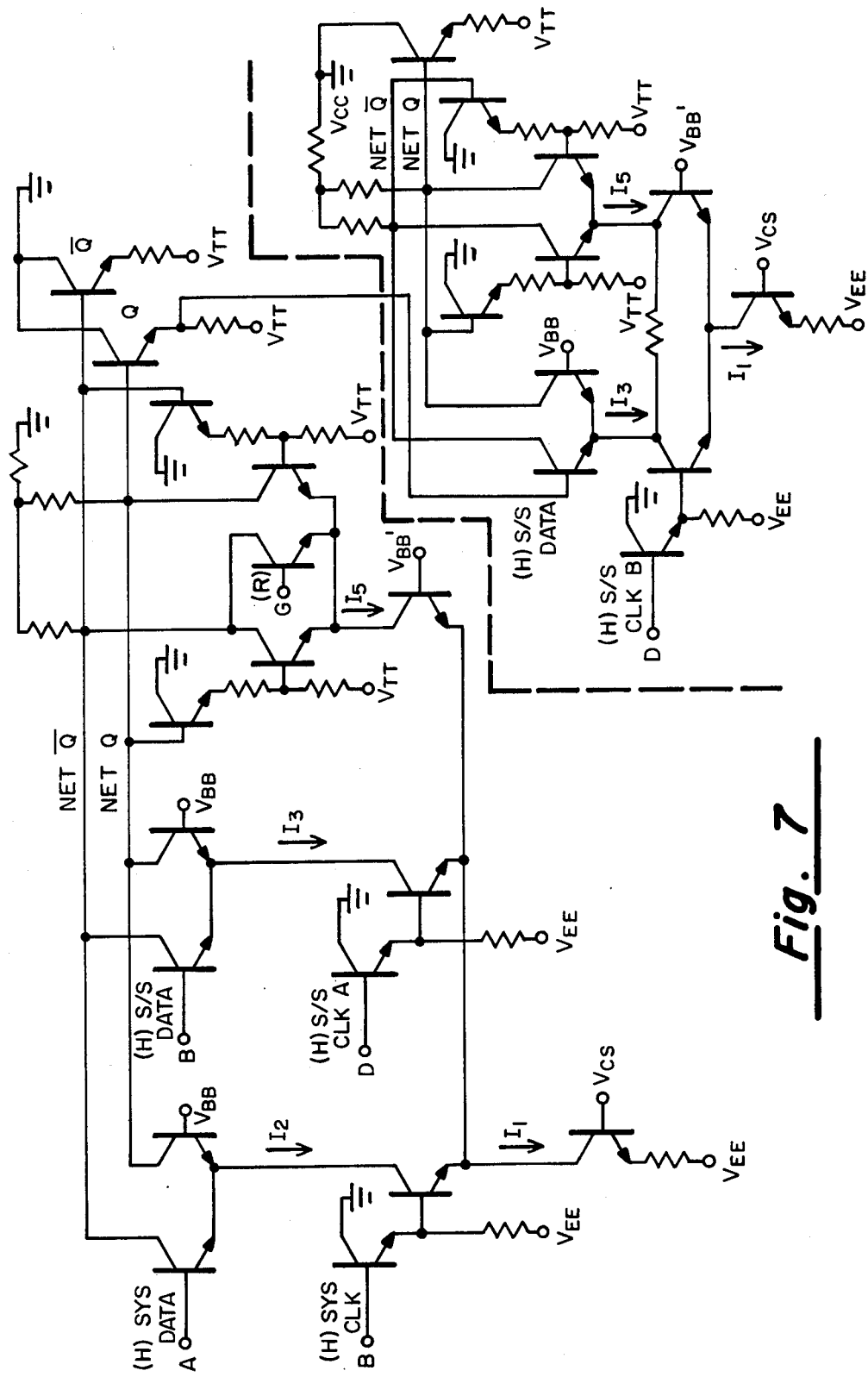
FIG. 7 shows a schematic diagram of a variant of that preferred embodiment ECL implementation of the scan/set testable latch of the present invention shown in FIG. 6e connected to a Rank B scan/set latch.

A further variation of the present invention incorporating the set and/or reset function as part of the differential feedback latch in the ECL implementation is shown in FIG. 7. Such FIG. 7 also shows the connection of a simplified, Rank B, slave latch—which latch is functionally illustrated as SCAN/SET TESTABLE LATCH RANK B in FIG. 3, which latch is illustrated in logic function in FIG. 2a, and which latch is a simplified form of the latch shown in electrical schematic in FIG. 2b—to the Rank A scan/set testable latch of the present invention. Such FIG. 7 shows that both such latches, the Rank A scan/set testable latch of the present invention plus an accompanying Rank B latch, can be implemented from two only of the standard cell building blocks shown in FIG. 1. The ECL implementation of two latches, the scan/set master and slave latches, shown in FIG. 7 utilizes 17 transistors in the master latch and 11 transistors in the slave latch, a total of 28 transistors.

There are additional, subsidiary, features and embellishments, which features are normal of inclusion in prior art scan/set testable latches, incorporated within the scan/set testable latch of the present invention. As already described for the particular embodiment, provision is made in the scan/set testable latch of the present invention to support multiphase clock systems wherein four or more phases are used in the system data path while only two phases are used in the scan/set path.

In summary of the preferred embodiments of the present invention, although the particular scan/set testable latch of the invention has several output signal states which are undetermined in respect of certain combinations of input signals, it allows the scan/set testable macro circuit of the present invention to be efficiently laid out using only one current source and minimum of silicon area while employ.ing common, building block, gate array cellular structures. The preferred embodiments scan/set testable latch of the present invention requires only 16 transistors and 10 resistors to implement in Emitter Coupled Logic, or 10 transistors and 3 resistors to implement in Current Mode Logic. Inclusion of a reset (or a set) capability adds 2 transistors and 1 resistor to the ECL embodiment, or 1 transistor to the CML embodiment.

While the present invention has been described with reference to two particular ECL and CML preferred embodiments, and with reference to settable and resettable variants of such preferred embodiments, it is to be recognized that the method of the present invention wherein an interconnected circuit is used to set or clear a feedback latch in accordance with scan/set test data, thereby rendering the entire latch plus interconnected circuit a scan/set testable latch, could be adapted by those skilled in the art to other configurations. For example, the relative usage of scan/set clock, and scan/set data signals as between the first and the second current switches could be altered without substantially altering the nature or operation of the present invention. For example, three current switches in series, each respectively controlled by the scan/set test enablement, clock, and data signals could have been used as an appended circuit in control of a latch of three series gated levels, although such is a more significant departure from the present invention which teaches, and claims, the advantages of two (only) levels of series gating. Therefore, the invention should not be construed narrowly but rather within the spirit and scope of the following claims:

What is claimed is:

1. In interconnection to and functional augmentation of a two-level-series-gated one-current-source feedback latch circuit employing one current source supplying current, serially connected to a first-level current-switch responisve to a received system clock signal for steering said current either to maintain, as a feedback current, said latch circuit in a set or clear state or else steering said current to one second-level current-switch responsive to a received system data signal for steering current received of said first-level current switch to either a clear Q or else to a set Q signal outputs of said latch circuit in order to respectively set or clear said latch circuit, a circuit apparatus interconnected to said feedback latch circuit for making said feedback latch fircuit functionally responsive to received scan/set data and scan/set clock signals thereby making said feedback latch circuit scan/set testable, said circuit apparatus comprising:

a first-level gating-circuit constituting a substitutionary inverting one-half of said first-level current switch while a normal inverting one-half of said first-level current switch is inactive due to absence of said received system clock signal, said first-level gating-circuit connected intermediary said current source and another second-level current switch, said first gating-circuit being interactive with the normal non-inverting one-half of said first-level current-switch, which said normal non-inverting one-half of said first-level current-switch is also connected to said current source and upon said first-level, in order to sufficiently form by said being interactive a complete current-switch upon said first-level, WHEREIN said complete current-switch is responsive to said scan/set clock signal for IF said scan/set clock signal is true THEN steering said current received of said current source to said another second-level current-switch ELSE IF said scan/set clock signal is false THEN steering no current to said another second-level current-switch and doing naught but presenting but a small, non-interfering, impedance to the operation of said normally constituted first-level current-switch; and said another second-level current switch is connected between said first-level gating circuit and said signal outputs of said feedback latch, comprising collector-dotted connections to each said clear Q and set Q signal outputs of said feedback latch circuit, for IF supplied with a current steered from said complete current-switch THEN, responsively to the binary state of a received said scan/set data signal, IF said scan/set data input signal is true THEN steering said current to said clear Q signal output of said feedback latch circuit sufficient to set said feedback latch circuit ELSE IF said scan/set data input signal is false THEN steering said current to said set Q signal output of said feedback latch circuit sufficient to clear said feedback latch circuit, ELSE IF not supplied with a current steered from said complete current-switch THEN doing naught but presenting a small capacitance to said set Q and said clear Q signal outputs of said feedback latch circuit.

2. The circuit apparatus interconnected to a feedback latch fircuit for making said feedback latch circuit scan/set testable of claim 1 wherein said complete current-switch further comprises:

a complete differential current-switch responsive to a received binary said scan/set clock signal for IF said scan/set clock signal is greater than a reference voltage THEN steering said current received of said current source to said another second-level current-switch ELSE IF said scan/set clock signal is less than said reference voltage THEN providing no current to said another second-level current-switch and doing naught but presenting a small impedance to the normal operation of normally constituted said first current-switch.

3. The circuit appparatus interconnected to a feedback latch circuit for making said feedback latch circuit scan/set testable to claim 1 which further comprises:

level shifter means for first receiving and for level shifting the received said scan/set clock signal, and for then transmitting a level-shifted said scan/set clock signal to said complete current-switch as said received binary scan/set clock signal.

4. The circuit apparatus interconnected to a feedback latch circuit for making said feedback latch circuit scan/set testable of claim 1 implemented in Emitter Coupled Logic, (ECL) in gate array technology.

5. The circuit apparatus interconnected to a feedback latch circuit for making said feedback latch circuit scan/set testable of claim 1 implemented in Current Mode Logic (CML) in gate array technology.

* * * * *